US010257957B2

(12) United States Patent
Barron et al.

(10) Patent No.: US 10,257,957 B2
(45) Date of Patent: Apr. 9, 2019

(54) COOLING SYSTEM FOR ELECTRONIC DEVICES EMPLOYING ADJACENT FAN CAGES WITH INTERFLOW PASSAGES (71) Applicant: International Business Machines Corporation, Armonk, NY (US)

(72) Inventors: David Paul Barron, Austin, TX (US); Howard Victor Mahaney, Jr., Cedar Park, TX (US); Phillip V. Mann, Rochester, MN (US); Matthew Tant Richardson, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 360 days.

(21) Appl. No.: 14/833,332

(22) Filed: Aug. 24, 2015

(65) Prior Publication Data
US 2016/0366785 A1 Dec. 15, 2016

Related U.S. Application Data (63) Continuation of application No. 14/738,491, filed on Jun. 12, 2015, now Pat. No. 9,681,579.

(51) Int. Cl.
*H05K 7/20* (2006.01)
(52) U.S. Cl.
CPC ..... *H05K 7/20145* (2013.01); *H05K 7/20136* (2013.01); *H05K 7/20736* (2013.01)
(58) Field of Classification Search
CPC .......... H05K 7/20145; H05K 7/20136; H05K 7/20736; H05K 7/1488; H05K 5/00
(Continued)

(56) References Cited

U.S. PATENT DOCUMENTS 4,162,067 A   7/1979  Horak et al.
5,680,295 A  10/1997  Le et al.
(Continued)

FOREIGN PATENT DOCUMENTS

EP    38030 A1   10/1981
EP   427656 A2    9/1990
EP   886463 A2   12/1998

OTHER PUBLICATIONS

Page, Robert W., and Jeffrey Kozierowski. Thermal management for the 21st century—improved thermal control & fuel economy in an army medium tactical vehicle. No. 2005-01-2068. SAE Technical Paper, 2005.
(Continued)

*Primary Examiner* — Gregory Huson
*Assistant Examiner* — Ryan Faulkner
(74) *Attorney, Agent, or Firm* — Patterson + Sheridan, LLP (57) ABSTRACT Cooling systems employing adjacent fan cages having cage walls with interflow passages are disclosed. A cooling system includes cooling fans disposed in adjacent fan cages. Cage walls of the fan cages direct flows from the fans to the outlet ports of the fan cages which are in fluid communication with electrical components within an electronics-containing enclosure. By forming an interflow passage between the adjacent fan cages, upon occurrence of an inoperable fan, a portion of the flow from an adjacent operable fan can pass to the outlet port of the fan cage of the inoperable fan via the passage and provide better cooling of the components impacted by the inoperable fan. In this manner, thermal damage is avoided while minimizing fan noise associated with higher fan speeds.

10 Claims, 9 Drawing Sheets

(58) Field of Classification Search
USPC .......................................................... 454/184
See application file for complete search history.

(56) References Cited

U.S. PATENT DOCUMENTS

| | | | |
|---|---|---|---|
| 6,776,706 | B2 | 8/2004 | Kipka et al. |
| 7,360,992 | B2 | 4/2008 | Cho |
| 9,655,284 | B2 * | 5/2017 | Milligan ............ H05K 7/20145 |
| 2003/0112601 | A1 | 6/2003 | Smith et al. |
| 2005/0276017 | A1 | 12/2005 | Aziz et al. |
| 2007/0190920 | A1 | 8/2007 | Gilliland et al. |
| 2009/0264060 | A1 | 10/2009 | Livchak et al. |
| 2013/0044430 | A1 * | 2/2013 | Carl, Jr. ............. H05K 7/20772 |
| | | | 361/695 |

OTHER PUBLICATIONS

Harner III, J. P., J. F. Smith, M. J. Brouk, J. P. Murphy, Gene Boomer, and Monsanto Dairy Business. "Reducing heat stress in the holding pens." InDairy Management Conference Jun. 21 & 22, p. 5. 2000.

IBM "List of IBM Patents or Patent Applications Treated as Related".

U.S. Application entitled Cooling System for Electronic Devices Employing Adjacent Fan Cages with Interflow Passages, filed Jun. 12, 2015.

* cited by examiner

COOLING SYSTEM FOR ELECTRONIC DEVICES EMPLOYING ADJACENT FAN CAGES WITH INTERFLOW PASSAGES

CROSS-REFERENCE TO RELATED APPLICATIONS

This application is a continuation of co-pending U.S. patent application Ser. No. 14/738,491, filed Jun. 12, 2015. The aforementioned related patent application is herein incorporated by reference in its entirety.

BACKGROUND

Embodiments of the present disclosure relate to cooling systems, and in particular, to cooling systems for electronic devices.

TECHNICAL BACKGROUND

Benefits of electronic enclosures include an establishment of an internal volume that provides protection and organization of the electronics contained therein. Protection may be provided, for example, from electromagnetic radiation, humidity, moisture, and heat. Items to be disposed within the internal volumes of electronic enclosures may be supported as part of modular elements which are secured to the electronics-containing enclosure (e.g., structural framework) of the electronic enclosure during use. The electronics-containing enclosure also precisely positions and firmly secures the modular elements, so that the internal volume may be populated to optimize cooling flow, resist vibration, maximize storage capacity, and/or provide convenient interfaces for modular elements to be efficiently replaced ("swapped out") by personnel without damage when maintenance and/or upgrades are required.

As technology improves, demands to reduce cost while simultaneously increasing performance continues, and there is an increasing need to populate enclosures with higher densities of components to reduce the footprints of data centers and/or improve the speed of electrical components by decreasing signal propagation distances therebetween. It is becoming more challenging, with the resultantly highly-populated enclosures, to ensure that heat-generating electrical components are sufficiently cooled. In order to provide cooling, cooling fans may be disposed proximate to the enclosures to provide cooling flow to the components within the enclosure. However, in some cases one of the cooling fans may become non-operational or otherwise inoperable from providing sufficient cooling air to a portion of the enclosure. Operators may eventually replace the non-operational cooling fan to provide the sufficient cooling air. However, when the non-operational cooling fan cannot be timely replaced, then the electronics may need to be shut down to minimize the risk of damage to the electrical components at that portion of the enclosure. The operational cooling fans that remain in operation may in some cases be controlled to operate at higher speeds in an effort to increase airflow to compensate for the inoperable cooling fan, but this is not always successful and increases audible noise generated by the fans which at some threshold becomes unacceptable for operators. New approaches are needed to provide sufficient cooling to enclosures at acceptable noise levels when one or more of the cooling fans fail.

SUMMARY

Cooling systems employing adjacent fan cages having cage walls with interflow passages are disclosed. According to an embodiment of the present disclosure, a method for cooling at least one electrical component disposed within an electronics-containing enclosure is disclosed. The method includes generating a plurality of cooling flows with adjacent cooling fans contained within respective adjacent fan cages. The method also includes directing the plurality of cooling flows from the plurality of operating cooling fans to outlet ports of the respective adjacent fan cages. Each of the outlet ports of the respective adjacent fan cages are in fluid communication with at least one of the electrical components contained within the electronics-containing enclosure. The method also includes, upon an occurrence of inoperable cooling fan, diverting a portion of a cooling flow from an operable cooling fan to the fan cage containing the inoperable cooling fan via at least one interflow passage. In this manner, damage may be avoided to the at least one electrical component cooled by the cooling flow ordinarily provided by the inoperable fan.

BRIEF DESCRIPTION OF THE SEVERAL VIEWS OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

FIGS. 2A through 2C are a top front-right perspective view, a rear-left perspective view, and a right view, respectively, of a first cooling module which is a first example of one of the cooling modules of the cooling system of FIG. 1A, the cooling module includes a cooling fan contained within a fan cage;

FIGS. 2D-1 and 2D-2 are close-up views of different examples of perforations having an oval cross-sectional area and an incompletely surrounded cross-sectional area, respectively;

FIGS. 3A and 3B are a top front-right perspective view and a rear-left perspective view, respectively, of the cooling module of FIGS. 2A through 2C with the fan cage illustrated in phantom lines to reveal the cooling fan therein;

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Cooling systems employing adjacent fan cages having cage walls with interflow passages are disclosed. A cooling system includes cooling fans disposed in adjacent fan cages which may be in abutment with each other or otherwise secured in adjacent positions with respect to each other. Cage walls of the fan cages direct flows from the fans to the outlet ports of the fan cages which are in fluid communication with electrical components within an electronics-containing enclosure. By forming an interflow passage between the adjacent fan cages, upon occurrence of an inoperable fan, a portion of the flow from an adjacent operable fan can pass to the outlet port of the fan cage of the inoperable fan via the passage and provide better cooling of the components impacted by the inoperable fan. In this manner, thermal damage is avoided while minimizing fan noise associated with higher fan speeds.

Figures 1A, 1B:
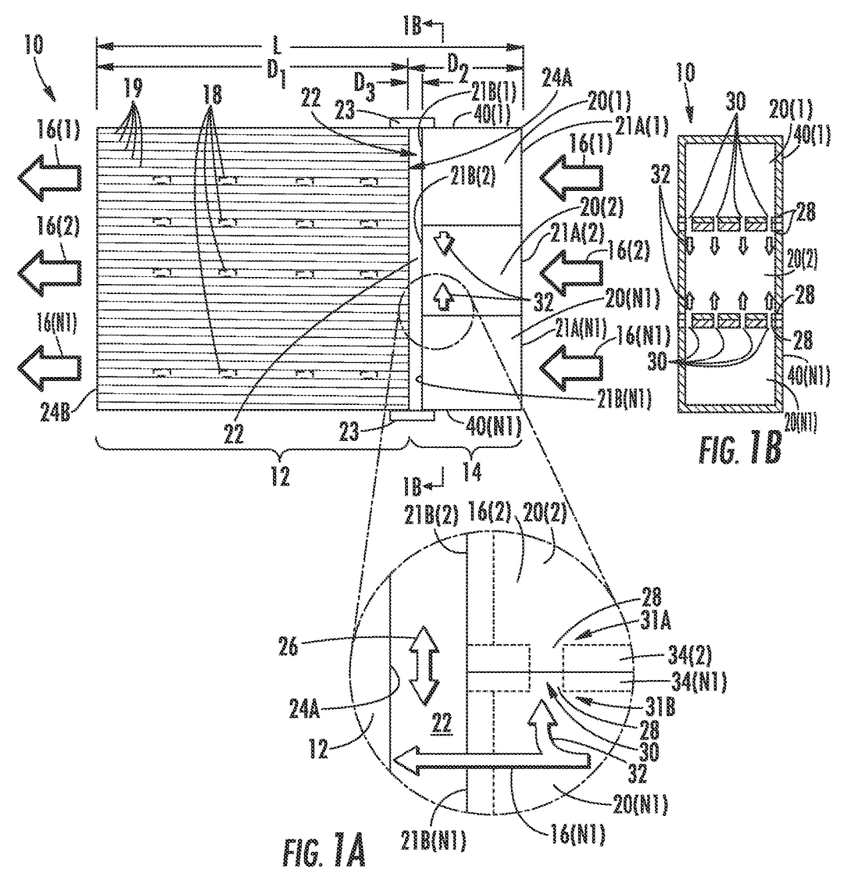
FIG. 1A is a left side schematic view of an exemplary electronic device including an electronics-containing enclosure and an exemplary cooling system having cooling modules providing a plurality of cooling flows to at least one electrical component disposed inside the electronics-containing enclosure.
FIGS. 1B and 1C are a front plan sectional view and a bottom left exploded plan view, respectively, of the electronic device of FIG. 1A.

In this regard, FIG. 1A is a left side schematic view of an electronic device 10 having a length L. The electronic device 10 may be a computer, server, or other apparatus including electronics. The electronic device 10 includes an electronics-containing enclosure 12 having a length D1 and a cooling system 14 having a length D2. The cooling system 14 includes cooling modules 20(1)-20(N1) with inlet ports 21A(1)-21A(N1) and outlet ports 21B(1)-21B(N1) providing a plurality of cooling flows 16(1)-16(N1) to at least one electrical component 18 disposed inside the electronics-containing enclosure 12. The electronics-containing enclosure 12 provides structural support and protection for the at least one electrical components 18 disposed therein. The electrical components 18 may, for example, include semiconductor-based processor and/or semiconductor-based storage components. The electrical components 18 may be secured to the electronics-containing enclosure 12 using mounting components 19, for example, racks or circuit boards. The plurality of cooling flows 16(1)-16(N1) may enter into the inlet ports 21A(1)-21A(N1) of the cooling modules 20(1)-20(N1) and exit through the outlet ports 21B(1)-21B(N1) before entering the frontal area 24A of the electronics-containing enclosure 12 by way of a plenum space 22 of the cooling system 14. The cooling flows 16(1)-16(N1) remove heat generated from the at least one electrical component 18 during operation of the electronic device 10 while within the electronics-containing enclosure 12, and then depart the electronics-containing enclosure 12 through a rear area 24B of the electronics-containing enclosure 12. The heat removal process between the cooling flows 16(1)-16(N1) and the electrical components 18 may be, for example, forced fluid convection heat transfer. The cooling flows 16(1)-16(N1) may be liquid or a gas (e.g., air). By removing heat from the electrical components 18, the electrical components 18 may operate within specified temperature levels. In this manner, the electrical components 18 may avoid thermal damage from overheating which may cause the electronic device 10 to stop operating.

A plenum space 22 may be disposed between the electronics-containing enclosure 12 and the cooling system 14 to maintain a more uniform cooling flow to the electronics-containing enclosure 12. The plenum space 22 is a volume of open space which is in fluid communication with the adjacent cooling modules 20(1)-20(N1), so that the cooling flows 16(1)-16(N1) are more uniformly distributed into a frontal area 24A of the electronics-containing enclosure 12. The plenum space 22 is formed by the frontal area 24A of the electronics-containing enclosure 12 and the outlet ports 21B(1)-21B(N1). The plenum space 22 may also be formed by at least one enclosure seal 23 in communication with one or more of the fan cages 34(1)-34(N1) and also the electronics-containing enclosure 12 to direct the cooling flows 16(1)-16(N1) from the outlet ports 21B(1)-21B(N1) to the frontal area 24A of the electronics-containing enclosure 12. The more uniform distribution is made possible by plenum flows 26 within the plenum space 22. The plenum flows 26 are secondary movements of some of the cooling flows 16(1)-16(N1) within the plenum space 22 that enable the cooling flows 16(1)-16(N1) to provide a more even flow into the frontal area 24A of the electronics-containing enclosure 12. An advantage of the more even flow is eliminating stagnant cooling flow areas of an interior of the electronics-containing enclosure 12 so as to enable the electrical components 18 to populate an interior of the electronics-containing enclosure 12 with a high density to thereby minimize a footprint of the electronic device 10. A smaller footprint is generally associated with lower operations costs as more electronic devices 10 may occupy a specific square footage of a facility to improve efficiency or smaller less expensive facilities can accommodate the same number of the electronic devices 10.

Moreover, in situations of involving an inoperable cooling module, the plenum space 22 also encourages the plenum flows 26 of cooling flows 16(1)-16(N1) from the cooling modules adjacent to an inoperable cooling module to diverge into a section of the frontal area 24A ordinarily cooled (or otherwise provided cooling flow) by the inoperable cooling module. Accordingly, some cooling flow may still be provided to the electrical components 18 that would be cooled by the inoperable cooling module and a density of the electronic components 18 may be increased with a lower risk of thermal damage in the case of an inoperable cooling module. In this manner, the more even cooling flow distribution along the frontal area 24A during situations when there is an inoperable cooling module enables a higher density of the electrical components 18 to populate the interior of the electronics-containing enclosure 12.

Figure 1C:
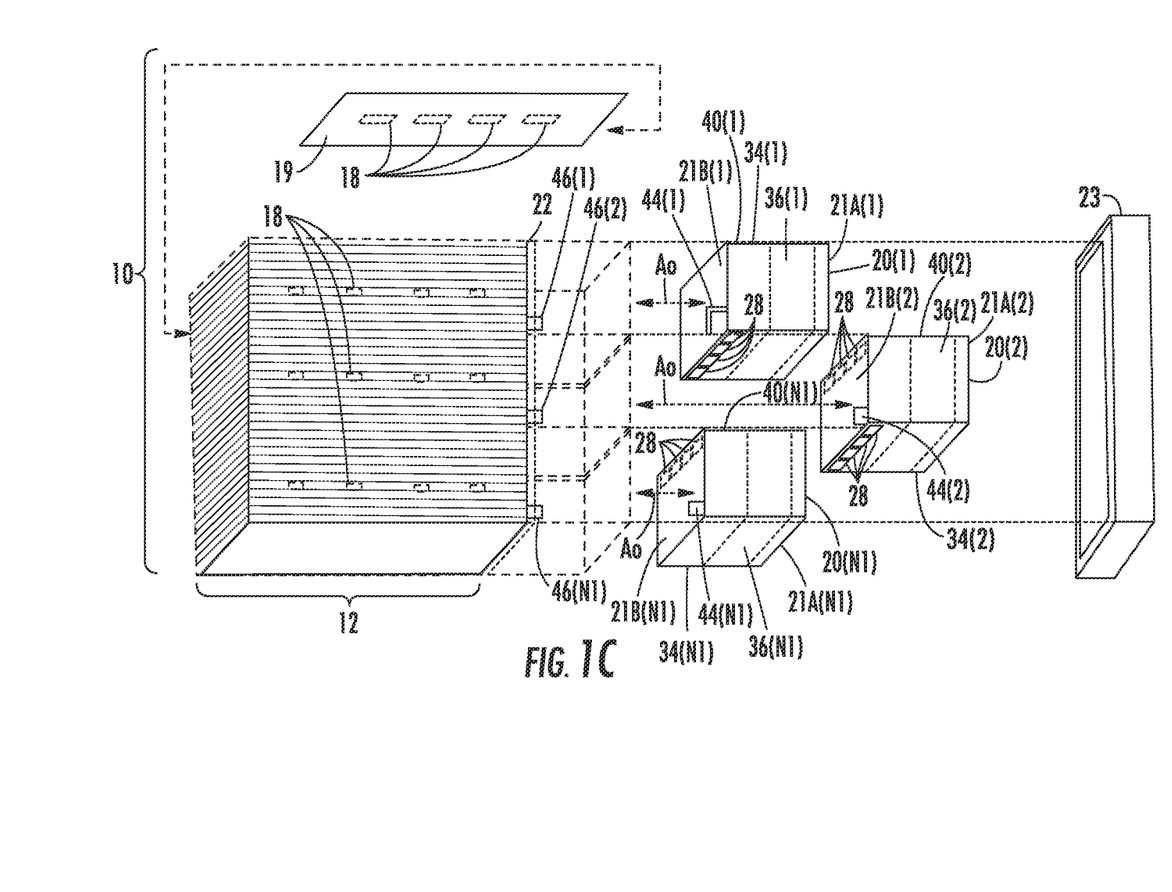

With continued reference to FIG. 1A, the plenum space 22 has a dimension of D3 along the length L of the electronic device 10. The dimension D3 may be, for example, equal or approximately equal to a radius of a cooling fan. The radius may be in a range from fifteen (15) millimeters to one-hundred (100) millimeters. In practical terms, the length L of the electronic device 10 may be preferably as short as possible to minimize the footprint of the electronic device 10. The length D1 of the electronics-containing enclosure 12 offers limited opportunity to reduce the footprint of the electronic device 10 as the length D1 may be determined by a type, size, and spacing of the at least one electrical component 18 within the electronics-containing enclosure 12. Further, the length D2 of the cooling modules 20(1)-20(N1) also offers limited opportunity to reduce the footprint as the length D2 may be determined by the flow rate and volume of the cooling flows 16(1)-16(N1) needed by the electrical components 18. Thus, reducing the dimension D3 of the plenum space 22 presents one opportunity to reduce the footprint of the electronic device 10. In response to this need, a plenum space 22 with a dimension D3 can achieve an efficacy of a larger plenum having a larger dimension D3 by providing interflow passages 30 between the cooling modules 20(1)-20(N1). In this regard, FIGS. 1B and 1C are a front plan sectional view and a bottom left exploded plan view, respectively, of the electronic device of FIG. 1A. The cooling modules 20(1)-20(N1) include perforations 28 which when aligned form the interflow passages 30 between the cooling modules 20(1)-20(N1). Each of the interflow passages 30 extends from a first end 31A at one of the fan cages 34(1)-34(N1) to a second end 31B at an adjacent one of the fan cages 34(1)-34(N1). Pressure differences between the first end 31A and the second end 31B of each of the interflow passages 30 may be caused by relative operations of cooling fans (discussed in more detail later) of the cooling modules 20(1)-20(N1). The pressure differences facilitate a diversion of portions 32 of the cooling flows 16(1)-16(N1) to be diverted from adjacent ones of the cooling modules 20(1)-20(N1) to an inoperable one of the cooling modules 20(1)-20(N1).

The portion of the flow diverted and the cross-sectional area of the interflow passages may be set according to the specific needs of the electronic device. For each of the cooling modules 20(1)-20(N1), the perforations 28 may have a cross-section in a range from ten (10) percent to one-hundred (100) percent of a cross-section of the outlet port of that cooling module. As a consequence of these cross-sections, the portion 32 diverted for any given cooling module may be in a second range from ten (10) to fifty (50) percent of the cooling flow passing through the cooling fan for that cooling module. In one non-limiting exemplary case, if there were two (2) cooling modules 20(1), 20(2) in the cooling system 14 and one cooling fan of the cooling module 20(2) became inoperable, it may be desirable in this case for half of the cooling flow 16(1) to be diverted to the cooling module 20(2) which has become inoperable. Hence, the collective cross-sectional equal area of the perforations of the cooling module forming interflow passages with an adjacent cooling module may be as large as the cross-sectional area of the outlet port of that cooling module to enable half the flow of the cooling module that is operational to be diverted to the inoperable cooling module. A similar situation would occur if there were a quantity of N1 cooling modules, and a cooling fan of the cooling modules 20(1), 20(N1) at the ends of the cooling system 14 became inoperable. For the general case with a quantity of N1 cooling modules 20(1)-20(N1) disposed in a row wherein the cooling modules 20(2)-20(N1−1) have two adjacent cooling modules, upon occurrence of the one of the cooling modules 20(2)-20(N1−1) becoming inoperable, it may be desirable for both of the adjacent fans to divert a third of their respective cooling flows to the inoperable cooling module. In that case, each of the operable cooling modules would retain two-thirds of their non-diverted flow to exit out of their respective outlet ports, and the inoperable cooling module would provide two-thirds of the normal cooling flow rate to its respective outlet port using the diverted cooling flow via the interflow passages. Since the cooling flow from the operational cooling modules would prefer to exit straight out of the respective outlet port of that cooling module instead of making two turns (one turn to go into the interflow passage and a second to turn from the exit of the interflow passage to the outlet port of the inoperable cooling module), a larger cross-sectional area of the perforations forming interflow passages to the inoperable fan may be desired to reduce the angles of the two turns required and facilitate the two-thirds flow split described above. Accordingly, specific ones of the electrical components 18 that are normally cooled by the inoperable one of the cooling modules 20(1)-20(N1) can be more effectively cooled by the portions 32 of the cooling flows 16(1)-16(N1) that have been diverted into the inoperable one of the cooling modules 20(1)-20(N1). In this manner, the ability of the electronic device 10 to improve the uniformity of the flow into the frontal area 24A of the electronics-containing enclosure 12 is improved by diverting portions 32 of the cooling flows 16(1)-16(N1) through the interflow passages 30 when one of the cooling modules 20(1)-20(N1) becomes inoperable.

In summary, it is noted that for a single row arrangement of cooling modules the percentage of flow diverted from each of the operable cooling modules to the inoperable cooling modules may be preferably be in a range from thirty-three (33) percent to fifty (50) percent depending upon whether the inoperable cooling fan is adjacent to one or two operable cooling fans. For other arrangements having more than two adjacent fans capable of providing cooling air to an inoperable fan the percentage of diverged flow may be different. In one different embodiment (discussed later with respect to FIG. 10B), with four (4) cooling modules diverting a percentage of their respective cooling flows to an inoperable cooling module, only a twenty percent diversion from each of the four (4) adjacent cooling modules may be diverted so that all five (5) of the cooling modules provide cooling flow at an eighty percent rate relative to if all of the five (5) were operating. Thus, an arrangement of cooling modules in a single row provides a practical upper limit for a percentage of diverted cooling flow from an operable cooling module to an adjacent inoperable cooling module.

With continued reference to FIGS. 1A through 1C, the cooling modules 20(1)-20(N1), respectively, include adjacent fan cages 34(1)-34(N1) enclosing respective ones of adjacent cooling fans 36(1)-36(N1). The cooling fans 36(1)-36(N1) generate respective ones of the cooling flows 16(1)-16(N1) from the inlet ports 21A(1)-21A(N1) of the fan cages 34(1)-34(N1) and through the cooling fans 36(1)-36(N1). Cage walls 40(1)-40(N1) of the adjacent fan cages 34(1)-34(N1) are configured to respectively direct the plurality of cooling flows 16(1)-16(N1) from the cooling fans 36(1)-36(N1) to the outlet ports 21B(1)-21B(N1) of respective ones of the fan cages 34(1)-34(N1). Each of the outlet ports 21B(1)-21B(N1) are configured to be in fluid communication with the at least one electrical component 18 contained within the electronics-containing enclosure 12. In this manner, the cooling modules 20(1)-20(N1) may provide the cooling flows 16(1)-16(N1) to the electronics-containing enclosure 12.

In order to provide power to the cooling fans 36(1)-36(N1), the cooling modules 20(1)-20(N1) are connected to a source of power. In this regard, the adjacent fan cages 34(1)-34(N1) may be removably attached to the electronics-containing enclosure 12. The removably attaching includes providing power to the adjacent cooling fans 36(1)-36(N1) by removably mating respective power interfaces 44(1)-44(N1) of the adjacent cooling fans 36(1)-36(N1) with electrical connectors 46(1)-46(N1) supported by the electronics-containing enclosure 12. The power interfaces 44(1)-44(N1) may be mated with the electrical connectors 46(1)-46(N1) in a same direction as the respective center axes A0 of the adjacent cooling fans 36(1)-36(N1). The mating may secure (i.e., removably secure) the cooling modules 20(1)-20(N1) to the electronics-containing enclosure 12. Fasteners and mechanical interfaces (not shown) may also be used in addition to or alternatively to the electrical connectors 46(1)-46(N1). In other examples of the electronic device 10, the mating may occur in the same direction as the adjacent fan cages 34(1)-34(N1) are removably attached to the electronics-containing enclosure 12. In this manner, power may be supplied to the cooling fans 36(1)-36(N1).

Figure 2A:
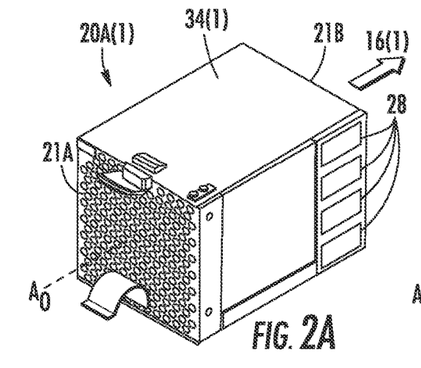
Figures 2B, 2C, 2D, 2D, 3B:
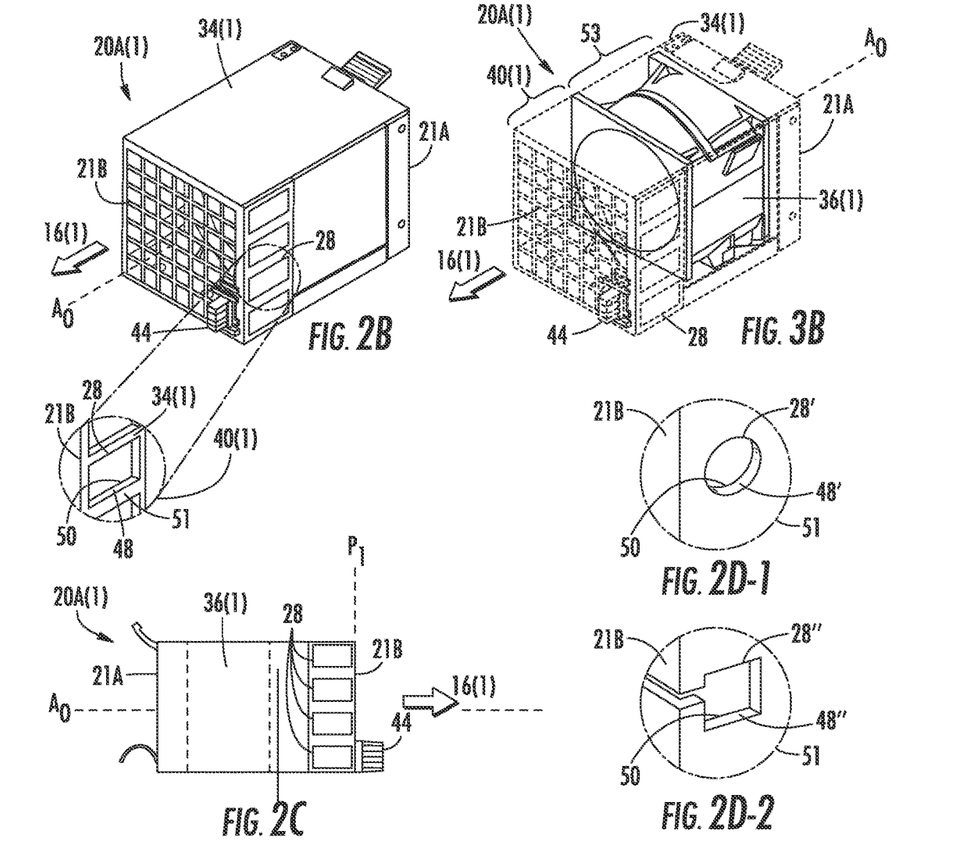

FIGS. 2A through 2C are a top front-right perspective view, a rear-left perspective view, and a right view, respectively, of a first cooling module 20A(1) which is a first example of one of the cooling modules of the cooling system 14 of FIG. 1A. The first cooling module 20A(1) includes the cooling fan 36(1) (shown in FIG. 2C) and the fan cage 34(1). As shown in the close-up of FIG. 2B, each of the perforations 28 of the fan cage 34(1) is formed by a respective perforation surface 48 connecting an inner surface 50 of the respective cage wall 40(1) with an exterior surface 51 of the respective cage wall 40(1). Each of the perforations 28 of the fan cage 34(1) may be surrounded by a respective perforation surface 48 of the cage wall 40(1). The perforation surface 48 may form a cross-sectional shape, for example, polygonal, hexagonal, triangular, circular, and oval (see FIG. 2D-1, perforation 28' formed by perforation surface 48'). Shapes which collectively maximize the cross-sectional area to increase a capacity and efficiency of the interflow passages between adjacent cooling modules are preferred. The perforation 28 may also in a different embodiment may be formed by a perforation surface 48" which may open to the outlet port 21B and incompletely surround the cross-sectional shape of the perforation 28" through the cage wall as depicted in FIG. 2D-2. Also, free form shapes are also preferred for the cross-sectional shape in embodiments of the cage wall having structures (such as electrical conduits or attachment mounts for cooling fans) that are not easily relocated to accommodate perforations. As discussed later, when the at least one perforation 28 of the cooling module 20A(1) is aligned with at least one perforation 28 of an adjacent first cooling module, the at least one interflow passage 30 is formed which can divert a portion of the cooling flows generated by the cooling fan 36(1) if an adjacent cooling module becomes inoperable. In this regard, the perforation surface 48 efficiently directs the movement of the diverted portion of the cooling flows through the interflow passage 30.

Figure 3A:
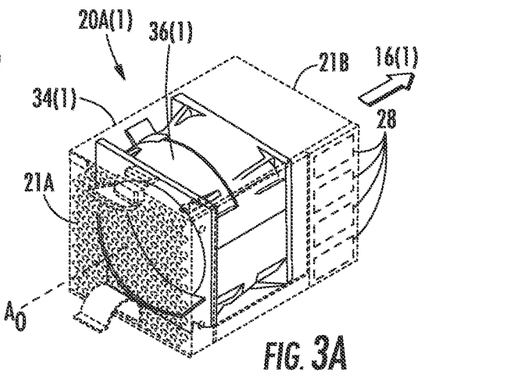
Figure 4:
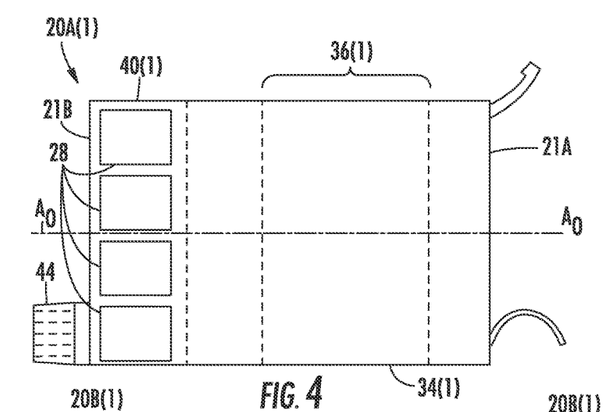
FIG. 4 is a left side view of the cooling module of FIGS. 2A through 2C.

FIGS. 3A and 3B are a top front-right perspective view and a rear-left perspective view, respectively of the cooling module 20A(1) of FIGS. 2A through 2C with the fan cage 34(1) illustrated in phantom lines to reveal the cooling fan 36(1) therein. FIG. 4 is a left side view of the cooling module 20A(1) of FIG. 2A. The cooling fan 36(1) may be configured to generate the cooling flows 16(1) from the inlet port 21A(1) to an exit of the cooling fan 36(1). The cooling fan 36(1) may be, for example, an axial-flow fan configured to create the cooling flow 16(1) comprising at least one of a gas and a liquid. The cage wall 40(1) of the fan cage 34(1) directs the cooling flow 16(1) from the cooling fan 36(1) to the outlet port 21B. In this regard, the cage wall 40(1) forms the outlet port 21B and connects the outlet port 21B to a section 53 (FIG. 3B) of the fan cage 34(1) which surrounds the cooling fan 36(1). The outlet port 21B may be formed in a geometric plane P1 (FIG. 2C) disposed orthogonal to the center axis A0 of the cooling fan 36(1). In this manner, the cooling flow 16(1) may exit the cooling module 20A(1) with maximum uniformity.

The cooling module 20A(1) also facilitates the movement of cooling flow between cage walls of adjacent cooling modules when collectively providing cooling air to the electronics-containing enclosure 12. In this regard, the cage wall 40(1) includes the perforations 28 so that when these perforations 28 are aligned with perforations 28 of an adjacent cooling module and assembled relative to the electronics-containing enclosure 12, the interflow passage 30 may be formed to divert a portion of the cooling flow generated by the cooling fan 36(1) if the cooling fan of the adjacent cooling module becomes inoperable.

Figure 5A:
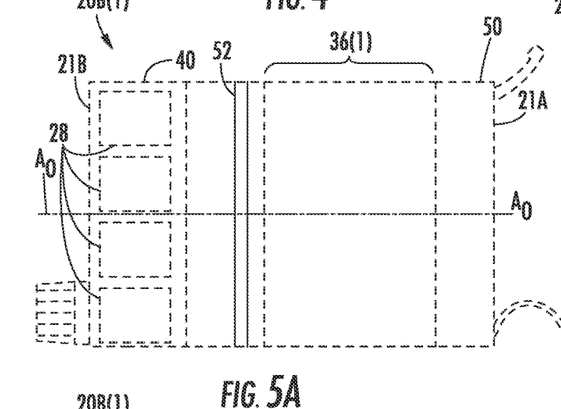
FIGS. 5A and 5B are a left side view and a rear view, respectively, of a second cooling module which is a second example of one of the cooling modules of the cooling system of FIG. 1A, the second cooling module includes a fluidic diode disposed within the fan cage and illustrated in a closed mode, wherein the fan cage and the cooling fan are depicted in phantom lines to provide an unobstructed view of the fluidic diode, and the closed mode prevents cooling flow at a rear of the fan cage from entering the cooling fan.
Figure 5B:
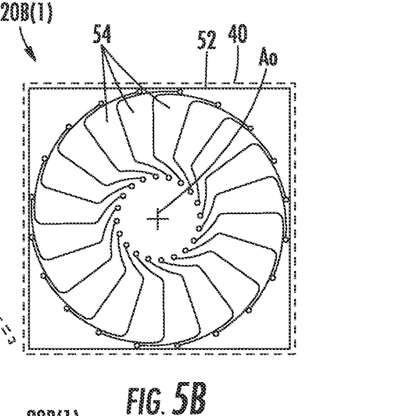

FIGS. 5A and 5B are a left side view and a rear view, respectively, of a second cooling module 20B(1) which is second example of one of the cooling modules of the cooling system 14 of FIG. 1A. The second cooling module 20B(1) includes a fluidic diode 52 disposed within the fan cage 34(1) and includes both open and closed modes. The fluidic diode 52 is illustrated in FIGS. 5A and 5B in a closed mode. The fluidic diode 52 may be for example, a diaphragm made of a flexible material (i.e., plastic) which includes vanes 54 which by default are closed consistent with the closed mode, but may be urged open when subjected to pressure generated by the cooling fan 36(1) disposed upstream of the fluidic diode 52 in the same fan cage 34(1). In the closed mode depicted in FIGS. 5A and 5B, the vanes 54 of the fluidic diode 52 are disposed in positions to prevent cooling flow from travelling from the interflow passage 30 to the cooling fan 36(1). In addition, the positions of the vanes in the closed mode may also prevent the cooling flow exiting from outlet ports of operational cooling modules from entering the plenum space 22 and travelling backwards through the outlet port of the inoperable cooling module to the cooling fan 36(1) of the inoperable cooling module. The positions of the vanes 54 may be, for example, orthogonal or substantially orthogonal to the center axis A0 (or alternatively to the flow direction) of the cooling fan 36(1). Specifically, in this closed mode, upon the cooling fan 36(1) becoming inoperable, the vanes 54 prevent flow of the cooling flows from cooling modules which are adjacent to the second cooling module 20B(1) from reaching the cooling fan 36(1) from the perforations 28 of the cooling module 20B(1) or the outlet port of the cooling module 20B(1). In this manner, if or when the cooling fan 36(1) becomes inoperable, the cooling flow(s) from adjacent cooling module(s) that enter the fan cage 34(1) through the interflow passages 30 are directed to the outlet port 21B(1) of the fan cage 34(1) to contribute to the cooling of the electronic components 18, and an alternative path away from the outlet port 21B(1) and to the inlet port 21A through the cooling fan 36(1) is blocked by the fluidic diode 52. It is noted that the fan cage 34(1) and the cooling fan 36(1) are depicted in phantom lines in FIG. 5A to provide an unobstructed view of the fluidic diode 52 in the closed mode.

In other examples (not shown) of the cooling module, the cooling fan may include at least some of the functionality of the fluidic diode 52 to prevent cooling flow from travelling backwards through the cooling fan if and when the cooling fan becomes inoperable. In this example, the cooling fan may be a dual-rotor fan assembly with two (2) cooling fans within the cooling module arranged in series. If one of the two cooling fans arranged in series becomes inoperable, the operational one of the two cooling fans arranged in series may prevent backward flow of the cooling flow through the cooling module. Consequently, the fluidic diode 52 may be omitted from the cooling module as redundant with the dual-rotor fan assembly.

Figure 6A:
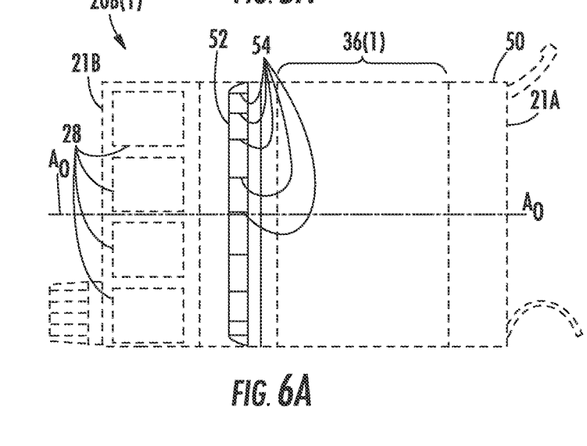
FIGS. 6A and 6B are a left side view and a rear view, respectively, of the second cooling module of FIGS. 5A and 5B depicting the fluidic diode in an open mode, wherein the fan cage and the cooling fan are depicted in phantom lines to provide an unobstructed view of the fluidic diode in the open mode, and the open mode enables cooling flow at the rear of the fan cage from entering the cooling fan.
Figure 6B:
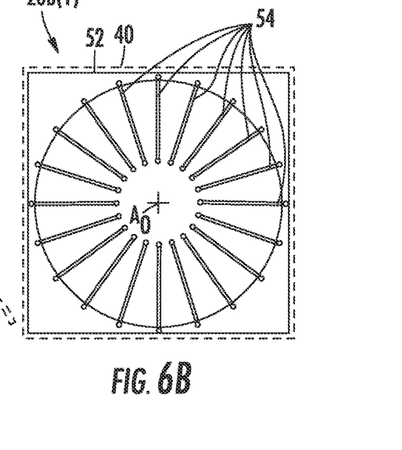

FIGS. 6A and 6B are a left side view and a rear view, respectively, of the second cooling module 20B(1) of FIG. 5A wherein the fluidic diode 52 is disposed within the fan cage 34(1) in an open mode. The open mode of the fluidic diode 52 is associated with the cooling fan 36(1) generating the cooling flow 16(1). In the open mode, the vanes 54 of the fluidic diode 52 are disposed in positions to permit the cooling flow 16(1) to flow from the cooling fan 36(1) to the outlet port 21B. The positions of the vanes 54, for example, may be non-orthogonal to the center axis A0 or parallel to the flow direction from the cooling fan 36(1) to the outlet port 21B of the cooling module 20B(1). In this manner, the cooling fan 36(1) can provide the cooling flow 16(1) to the electrical components 18 in the electronics-containing enclosure 12 via the outlet port 21B and minimize reverse flow of cooling flows from the outlet port 21B (or the perforations 28) to the cooling fan 36(1) in case the cooling fan 36(1) becomes inoperable.

Figure 7A:
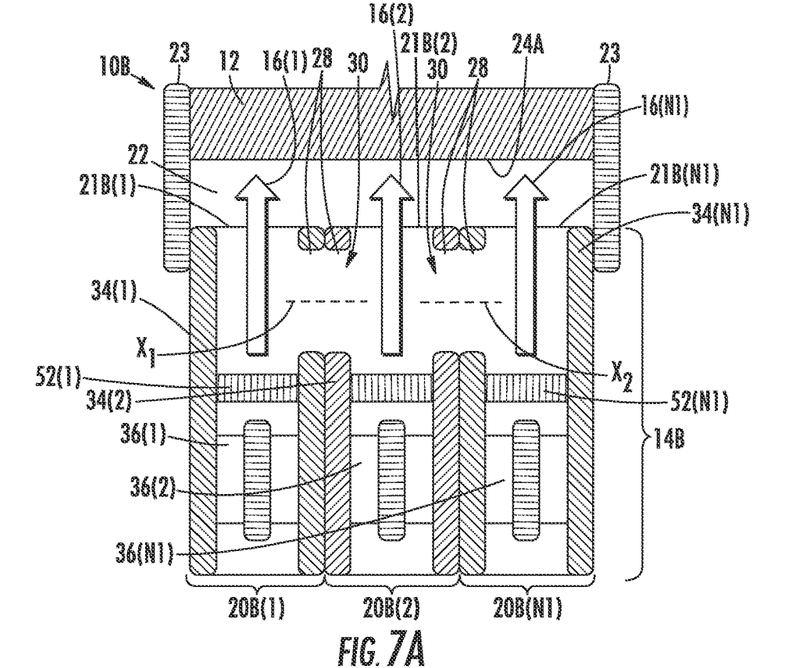
FIG. 7A is a top plan schematic view of the plurality of cooling flows being provided to the electronics-containing enclosure by an embodiment of the cooling system including a plurality of the second cooling modules of FIGS. 5A through 6B with interflow passages formed by perforations in fan cages and aligned with each other, wherein all of adjacent cooling fans of the cooling system are in operation.

FIG. 7A is a top plan schematic view of the plurality of cooling flows 16(1)-16(N1) being provided to the electronics-containing enclosure 12 by cooling system 14B which is a different example of the cooling system of FIG. 1A. The cooling system 14B includes the fluidic diodes 52(1)-52(N1) and so is different from the cooling system 14 of FIG. 1A. The cooling system 14B comprises the second cooling module 20B(1) of FIGS. 5A through 6B as part of a plurality of second cooling modules 20B(1)-20B(N1) with the interflow passages 30 formed by the perforations 28 in the fan cages 34(1)-34(N1). The perforations 28 are aligned with each other so that a center axis of the perforation 28 of the cooling module 20B(1) is co-linear with a center axis of a complementary perforation 28 of the adjacent cooling module 20B(2) along an axis $X_1$. Similarly, a center axis of the perforation 28 of the cooling module 20B(2) is co-linear with a center axis of a complementary perforation 28 of the adjacent cooling module 20B(N1) along an axis $X_2$. In this manner, the alignment enables the interflow passage 30 to be formed to efficiently exchange air between adjacent second cooling modules.

It is noted that FIG. 7A depicts all of the adjacent cooling fans 36(1)-36(N1) of the cooling system 14B in operation as part of a second electronic device 10B. The cooling flows 16(1)-16(N1) may be of the same flow rate Q0 (as depicted later with solid lines in FIG. 7C) indicating that all of the cooling fans 36(1)-36(N1) are in operation. As each of the flow rates Q0 are the same, the interflow passages 30 pass a minimal amount of the cooling flows 16(1)-16(N1). This minimal amount is facilitated by having the cage walls 40(1)-40(N1) disposed parallel to a direction of the cooling flows 16(1)-16(N1) (or the axes of the cooling fans 36(1)-36(N1)) as the cooling flows 16(1)-16(N1) exit the outlet port 21B(1)-21B(N1). In this manner, the cooling flows 16(1)-16(N1) generated by the cooling fans 36(1)-36(N1) respectively exit through the outlet ports 21B(1)-21B(N1) of the cooling modules 20B(1)-20B(N1) with minimum interference (or pressure loss) from the interflow passages 30. Higher levels of interference and pressure loss would undesirably lessen the flow rate of the cooling flows 16(1)-16(N1) to the electronics-containing enclosure 12 or require the cooling fans 36(1)-36(N1) to operate at higher power levels to compensate for the higher interference and pressure loss.

Figure 7B:
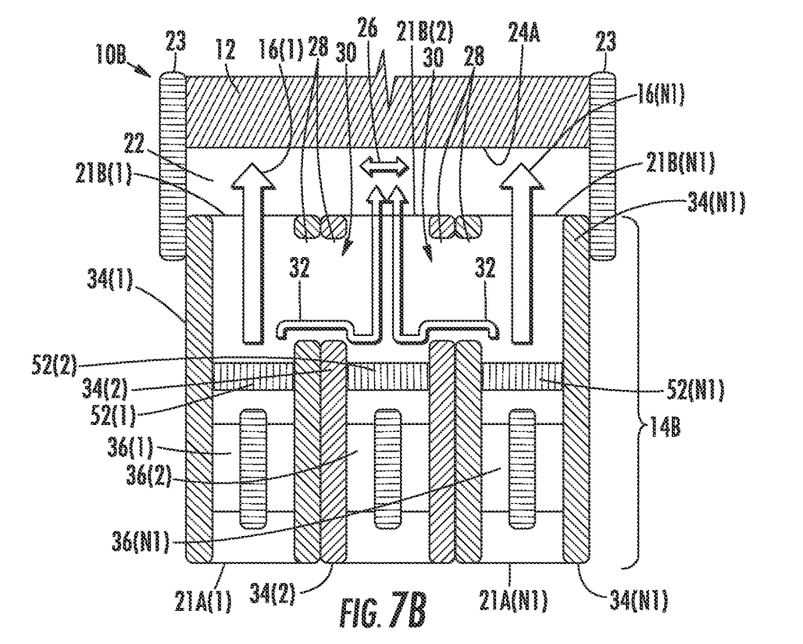
FIG. 7B is a top plan schematic view of the cooling system of FIG. 7A providing cooling flows to the electronics-containing enclosure with one of the adjacent cooling fans being inoperable.

In contrast, FIG. 7B is a top plan schematic of the cooling system 14B of FIG. 7A providing the cooling flows 16(1), 16(N1) to the electronics-containing enclosure 12 with the cooling fan 36(2) of the second cooling module 20B(2) being inoperable. In this inoperable condition, the cooling fan 36(2) does not generate the cooling flow 16(2) from the inlet port 21A(2) to an exit of the cooling fan 36(2). Upon the occurrence when the cooling fan 36(2) is inoperable and the adjacent cooling fans 36(1), 36(N1) are in operation, the plenum flows 26 will form in the plenum space 22 that is in fluid communication with the adjacent cooling modules 20(1)-20(N1), so that the cooling flows 16(1)-16(N1) are more evenly distributed into the frontal area 24A. In this manner, some of the cooling flows 16(1), 16(N1) may serve to provide cooling for the at least one electrical component 18 that would have been provided by the cooling flow 16(2) from the cooling fan 36(2) if it were not inoperable in this exemplary situation depicted in FIG. 7B. It is noted that the fluidic diode 52(2) prevents the plenum flows 26 from reaching the cooling fan 36(2).

The operation of the interflow passages 30 may be based on pressure differences between the first end 31A and the second end 31B (FIG. 1A) of the interflow passages 30 wherein the pressure difference is based on activity of the cooling fans 36(1)-36(N1). Upon the occurrence when the cooling fan 36(2) is inoperable and the adjacent cooling fans 36(1), 36(N1) are in operation, a pressure difference is created between exits of the adjacent cooling fans 36(1), 36(2) and a second pressure difference is created between exits of the adjacent cooling fans 36(N1), 36(2). Based on the pressure differences, the interflow passages 30 are configured to divert the portions 32 of respective cooling flows 16(1), 16(N1) from the adjacent cooling fans 36(1), 36(N1) to the outlet port 21B(2) of the fan cage 34(2) containing the inoperable cooling fan 36(2). In this manner, a more uniform cooling flow distribution may be delivered to the electronics-containing enclosure 12 despite the inoperable cooling fan 36(2). It is noted that the plenum flows 26 may still exist in the plenum space 22 of FIG. 7B, but are not illustrated to emphasize the operation of the interflow passages 30. Also, the dimension D3 (FIG. 1A) of the plenum space 22 may be reduced to make smaller the footprint of the electronic device 10 as some of the burden to create a more uniform cooling flow to the electronics-containing enclosure 12 is now carried by the interflow passages 30 instead of merely by the plenum space 22.

Figure 7C:
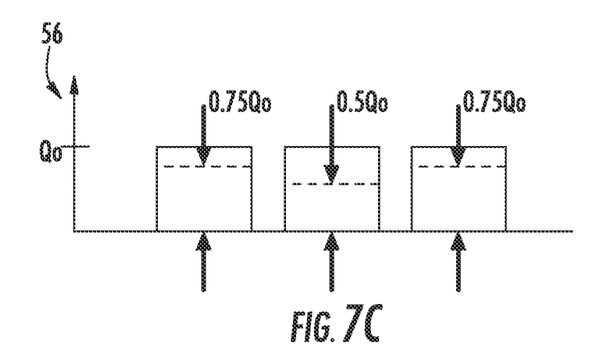
FIG. 7C is a graph of effective cooling flow rates received from portions of the electronics-containing enclosure which are associated with the adjacent cooling fans as depicted in FIGS. 7A and 7B, respectively.

FIG. 7C is a graph 56 of effective cooling flow rates received from portions of the electronics-containing enclosure 12 which are associated with the adjacent cooling fans 36(1)-36(N1) as depicted in FIGS. 7A and 7B, respectively. The graph 56 presents the effective cooling rates from the exemplary situation depicted in FIG. 7A in solid lines where each of the cooling fans 36(1)-36(N1) are in operation and the exemplary situation depicted in FIG. 7B in broken lines where each of the cooling fans 36(1), 36(N1) are in operation and the cooling fan 36(2) is inoperable. As is shown in the exemplary data, when the cooling fan 36(2) is inoperable, half of the effective cooling flow rate Q0 is received by the at least one electrical components 18 that would normally receive the cooling flow 16(2) compared to when the cooling fan 36(2) is in operation and these same components receive the cooling flow rate Q0. However, this is merely an example and the amount of diverted flow could be more or less based on many factors including at least: a cooling flow impedance of the electronics-containing enclosure 12, as well as a cross-sectional area and location of the perforations 28 providing the diverted airflow to the inoperable cooling module. Specifically, the cooling system 14 may be configured during design of the electronic device 10 to have an inoperable cooling module receive half its normal airflow (as depicted in FIG. 7C) and the percentage of this airflow could be arranged to have a different value depending upon the thermal requirements of the electronic device 10. In any case, the interflow passages 30 provide a significant thermal benefit over electronic devices not having the interflow passages in case a cooling module becomes inoperable.

Figure 8:
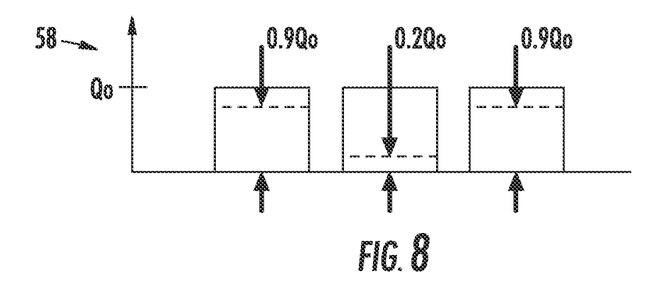
FIG. 8 is a second graph of effective cooling flow rates received from portions of the electronics-containing enclosure when the second cooling modules do not include the interflow passages of FIGS. 7A and 7B, respectively.

FIG. 8 is a second graph 58 of effective cooling flow rates received from portions of the electronics-containing enclosure 12 if the second cooling modules 20B(1)-20B(N1) did not include the interflow passages 30 of FIGS. 7A and 7B, respectively. It also represents an experimental situation if the interflow passages 30 were blocked to prevent movement of the portions 32 of the respective cooling flows 16(1), 16(N1). The second graph 58 presents the effective cooling rates received from portions of the electronics-containing enclosure 12 wherein solid lines similarly represent the situation when all the cooling fans 36(1)-36(N1) are in operation and the broken lines represent the situation when only the cooling fan 36(2) is inoperable. As is shown in the exemplary data of the second graph 58, only twenty (20) percent of the effective cooling flow rate Q0 is received by a portion of the electrical components 18 when the cooling fan 36(2) is inoperable compared to when the cooling fan 36(2) is in operation. This reduction in flow rate depicted in FIG. 8 is an eighty (80) percent reduction in flow rate Q0 as experienced by the electronic components that normally would receive the flow rate Q0 when the cooling fan 36(2) is operable, and is inferior to the situation in FIG. 7C wherein only a fifty (50) percent reduction in the flow rate Q0 is observed when the interflow passages 30 are utilized. In this manner, without the interflow passages 30 some of the electrical components 18 may be more vulnerable to thermal damage if or when one of the cooling fans 36(1)-36(N1) becomes inoperable.

With continued comparison of FIG. 8 with FIG. 7C, it can be observed that the combination of the plenum space 22 and the interflow passages 30 provide a more uniform flow to the electronics-containing enclosure 12 in the case of an inoperable fan than with merely the use of the plenum space 22 alone. The practical benefit of having a more uniform flow is that the thermal impact of the inoperable cooling fan is lessened and thermal damage to the at least one electrical component 18 can be more easily avoided as the cooling flow that is available with the remaining cooling fans in operation is more optimally allocated to replace the missing cooling flow from the inoperable fan.

Figure 9:
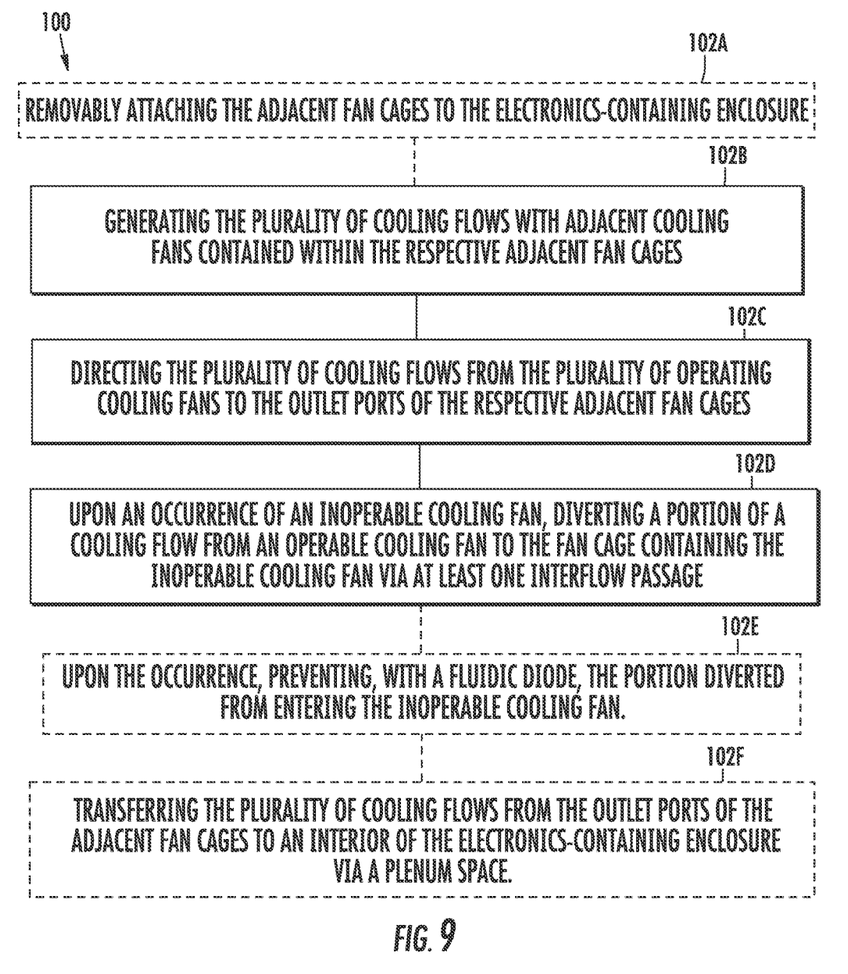
FIG. 9 is an exemplary flowchart of a method for cooling the at least one electrical component disposed within the electronics-containing enclosure of FIG. 1A.

Now that the components and embodiments of the electronic device 10 have been discussed, FIG. 9 depicts a flow chart of an exemplary method 100 for cooling the at least one electrical component 18 disposed within the electronics-containing enclosure 12. The method 100 includes the operations 102A through 102F which are discussed below using the terminology discussed above. Operations 102A, 102E, and 102F depicted in broken lines are optional and thereby may be applicable to only some embodiments.

In this regard, the method 100 may include removably attaching the adjacent fan cages 34(1)-34(N1) to the electronics-containing enclosure 12 (operation 102A of FIG. 9). The removably attaching may include providing power to the adjacent cooling fans 36(1)-36(N1) by removably mating the respective power interfaces 44(1)-44(N1) of the adjacent cooling fans 36(1)-36(N1) with the electrical connectors 46(1)-46(N1) supported by the electronics-containing enclosure 12. The method 100 includes generating, with the adjacent cooling fans 36(1)-36(N1) contained within respective ones of the adjacent fan cages 34(1)-34(N1), a respective plurality of cooling flows 16(1)-16(N1) (operation 102B of FIG. 9). In this manner, the cooling flows 16(1)-16(N1) may be created for cooling the at least one electrical component 18.

The method 100 may also include directing, with cage walls 40(1)-40(N1) of the adjacent fan cages 34(1)-34(N1), the plurality of cooling flows 16(1)-16(N1) from the plurality of operating cooling fans 36(1)-36(N1) to the outlet ports 21B(1)-21B(N1) of the respective adjacent fan cages 34(1)-34(N1) (operation 102C of FIG. 9). In this manner, the cooling flows 16(1)-16(N1) may be provided to the at least one electrical component 18.

The method 100 may also include upon an occurrence of an inoperable one of the adjacent cooling fans 36(1)-36(N1), diverting the portion 32 of the respective cooling flow from an operable one of the adjacent cooling fans 36(1)-36(N1) to the fan cage containing the inoperable one of the adjacent cooling fans via the interflow passage 30 (operation 102D of FIG. 9). The method 100 may also include upon the occurrence, preventing, with the fluidic diode 52, the diverting portion of the cooling flow from entering the inoperable one of the adjacent cooling fans 36(1)-36(N1) (operation 102E of FIG. 9). The method 100 may also include transferring the plurality of cooling flows from the outlet ports of the adjacent fan cages to an interior of the electronics-containing enclosure 12 via the plenum space 22 (operation 102F of FIG. 9). The plenum space 22 is in fluid communication with the outlet ports of the adjacent fan cages 34(1)-34(N1). In this manner, thermal damage may be avoided to the at least one electrical component 18.

Figure 10A:
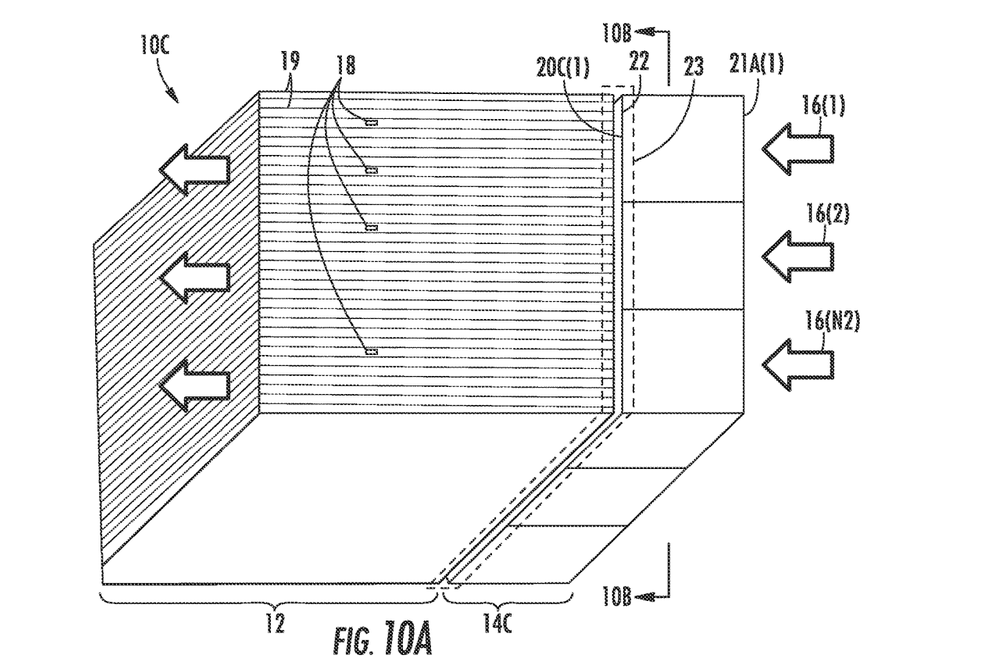
FIGS. 10A and 10B are a bottom left perspective plan view and a rear side view, respectively, of a second electronic device which is a different embodiment of an electronic device of FIG. 1A, the second electronic device includes the electronics-containing enclosure and a cooling system including third cooling modules providing a plurality of cooling flows to at least one electrical component disposed inside the electronics-containing enclosure, wherein the adjacent third cooling modules of the third cooling modules are arranged in rows and columns.
Figure 10B:
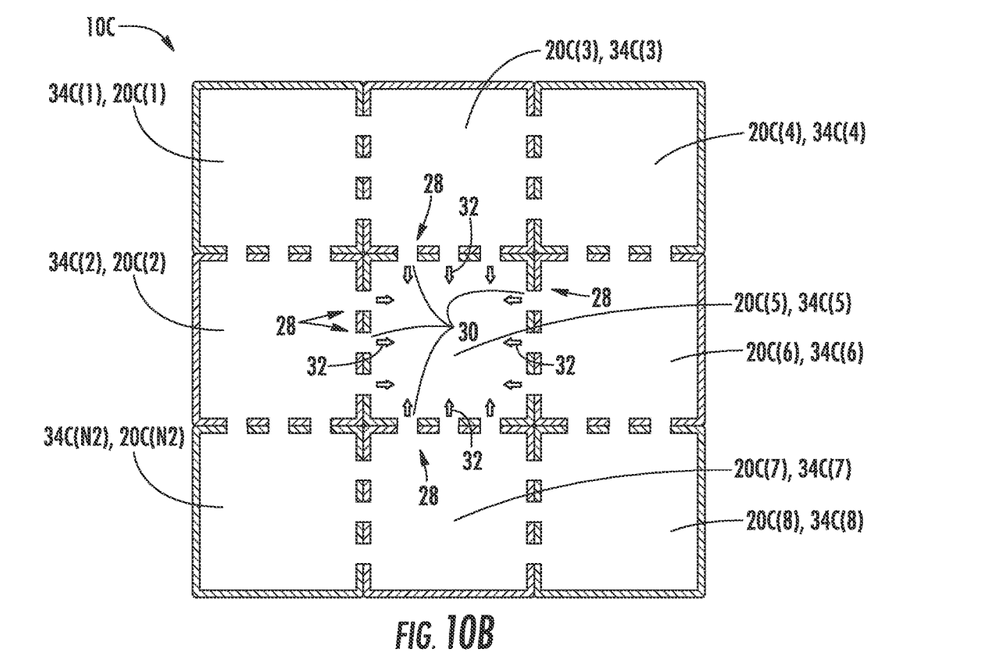

Other examples of the electronic device 10 are possible. FIGS. 10A and 10B are a bottom left perspective plan view and a rear side view, respectively, of a third electronic device 10C which is a different embodiment of the electronic device 10 of FIG. 1A. The third electronic device 10C includes the electronics-containing enclosure 12 and a cooling system 14C. The cooling system 14C includes adjacent cooling modules 20C(1)-20C(N2) providing a plurality of cooling flows 16(1)-16(N2) to the at least one electrical component 18 disposed inside the electronics-containing enclosure 12. In contrast to cooling system 14B of FIG. 7A, the adjacent fan cages 34C(1)-34C(N2) of the cooling system 14C depicted in FIGS. 10A and 10B are arranged in rows and columns, and each of the adjacent fan cages 34C(1)-34C(N2) have a rectangular cross-sectional shape. The interflow passages 30 are formed from the perforations 28 on adjacent surfaces of the adjacent fan cages 34C(1)-34C(N2) which meet at corners of the adjacent fan cages 34C(1)-34C(N2). In this manner, additional adjacent cooling modules 20C(1)-20C(N2) are available (in this case four) to divert portions of their cooling flow into a single cooling module 20C(5) which may contain an inoperable cooling fan.

Figures 11A, 11B:
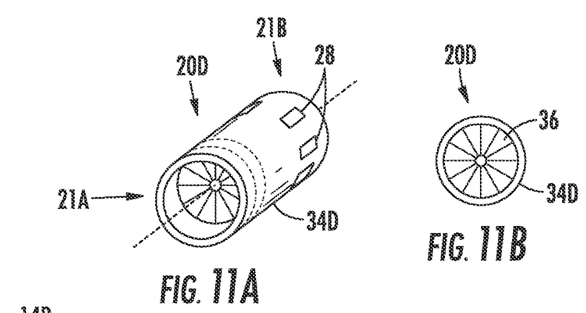
FIGS. 11A through 11C are a top-front perspective view, a front view, and a right view, respectively of a fourth cooling module which is a different embodiment of the cooling module of FIG. 1A, wherein the fan cage of the fourth cooling module has a circular cross-sectional shape.
Figure 11C:
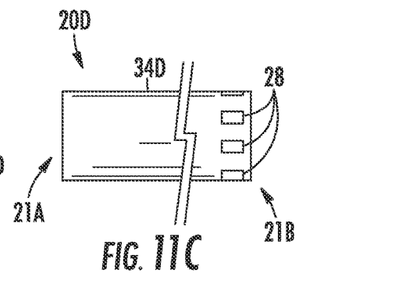
Figures 11D, 12A, 12B, 12C, 12D:
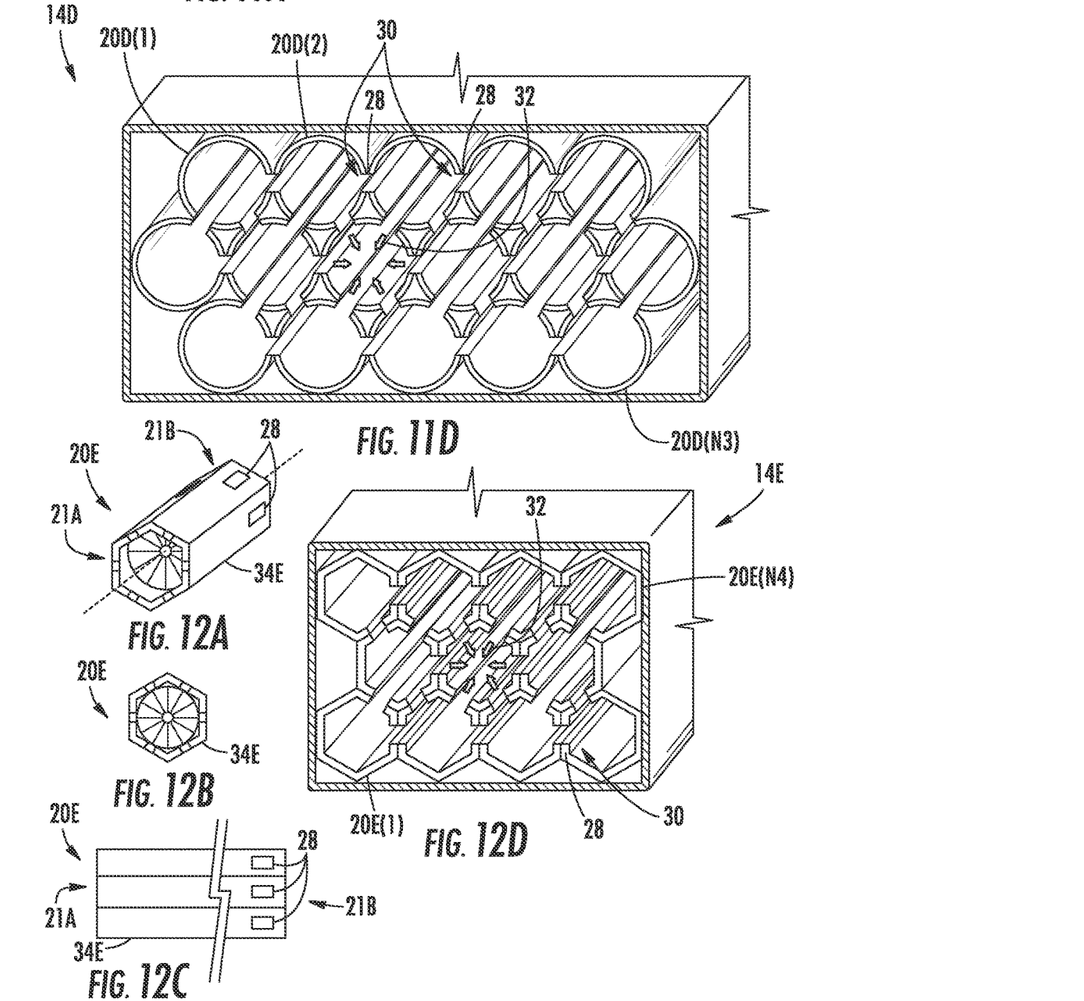
FIG. 11D is a top-rear perspective sectional view of an exemplary cooling system having adjacent cooling modules including the fourth cooling module of FIG. 11A.
FIGS. 12A through 12C are a front perspective view, a front view, and a right view, respectively, of a fifth cooling module which is another embodiment of the cooling module of FIG. 1A, wherein the fan cage of the fifth cooling module has a hexagonal cross-sectional shape.
FIG. 12D is a top-rear perspective sectional view of an exemplary cooling system having adjacent cooling modules including the fifth cooling module of FIGS. 12A through 12C.

In yet a different embodiment, FIGS. 11A through 11C are a top-front perspective view, a front view, and a right view, respectively of a fourth cooling module 20D which may be a part of a different embodiment of the cooling module 20(1) of FIG. 1A. The fan cage 34D of the fourth cooling module 20D has a circular cross-sectional shape to facilitate additional interflow passages 30 to be formed between adjacent fourth cooling modules 20D. FIG. 11D is a top-rear perspective sectional view of an exemplary cooling system 14D having adjacent cooling modules 20C(1)-20C(N3) including the fourth cooling module 20D of FIGS. 11A through 11C. In this manner, additional adjacent fourth cooling modules 20D(1)-20D(N3) are available (in this case six) to divert portions 32 of their cooling flow into a single fourth cooling module having an inoperable cooling fan.

In a different embodiment, FIGS. 12A through 12C are a front perspective view, a front view, and a right view, respectively of a fifth cooling module 20E which may be a part of a different embodiment of the cooling module 20(1) of FIG. 1A, wherein the fan cage 34E of the fifth cooling module 20E has a hexagonal cross-sectional shape. FIG. 12D is a top-rear perspective sectional view of an exemplary cooling system 14E having adjacent fifth cooling modules 20E(1)-20E(N4) including the cooling module 20E of FIGS. 12A through 12C. In this manner, additional adjacent fifth cooling modules 20E(1)-20E(N4) are available (in this case six) to divert portions 32 of their cooling flow into a single fifth cooling module associated with an inoperable cooling fan.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer-readable program instructions.

While the foregoing is directed to embodiments of the present invention, other and further embodiments of the invention may be devised without departing from the basic scope thereof, and the scope thereof is determined by the claims that follow.

What is claimed is:

1. A method for cooling at least one electrical component disposed within an electronics-containing enclosure, the method comprising:
   generating a plurality of cooling flows with a plurality of adjacent cooling fans contained within respective adjacent fan cages;
   directing the plurality of cooling flows from the plurality of cooling fans to outlet ports of the respective adjacent fan cages, wherein each of the outlet ports of the respective adjacent fan cages are in fluid communication with at least one of the electrical components contained within the electronics-containing enclosure; and
   upon an occurrence of an inoperable cooling fan, diverting a portion of a cooling flow from an operable cooling fan of the plurality of cooling fans to inside the fan cage containing the inoperable cooling fan via at least one interflow passage, wherein, while the inoperable cooling fan remains inside the fan cage, the diverted portion is prevented from entering the inoperable cooling fan.

2. The method of claim 1, wherein upon the occurrence, the portion diverted is in a range from ten (10) percent to fifty (50) percent of the cooling flow passing through the operable one of the adjacent cooling fans.

3. The method of claim 1, wherein a fluidic diode is used to prevent the diverted portion from entering the inoperable cooling fan, the fluidic diode configured to close automatically upon the occurrence of the inoperable cooling fan.

4. The method of claim 1, wherein the diverting includes the at least one interflow passage formed by perforations of cage walls of the adjacent fan cages, wherein perforation surfaces of the adjacent fan cages each entirely surround the respective perforations.

5. The method of claim 4, wherein the diverting includes each of the perforation surfaces of the adjacent fan cages forms a rectangular cross-sectional shape.

6. The method of claim 1, further comprising transferring the plurality of cooling flows from the outlet ports of the adjacent fan cages to an interior of the electronics-containing enclosure via a plenum space, wherein the plenum space is in fluid communication with the outlet ports of the adjacent fan cages.

7. The method of claim 1, wherein the diverting includes the at least one interflow passage guiding the diverted portion between ends of the at least one interflow passage disposed between cage walls of the adjacent fan cages, and the cage walls having further openings allowing the portion of the cooling flow there-thru and being disposed parallel or substantially parallel to center axes of the operative and the inoperative cooling fans.

8. The method of claim 1, further comprising removably attaching the adjacent fan cages to the electronics-containing enclosure, wherein the removably attaching includes providing power to the adjacent cooling fans by removably mating respective power interfaces of the adjacent cooling fans with an electrical connector supported by the electronics-containing enclosure in a same direction as respective center axes of the adjacent cooling fans.

9. The method of claim 8, wherein the removably attaching includes creating an abutment between cage walls of the adjacent fan cages.

10. The method of claim 1, wherein at least a portion of the cooling flow from the operable cooling fan flows through the outlet port of the fan cage containing the inoperable cooling fan.

* * * * *